United States Patent Office 3,469,982

Patented Sept. 30, 1969

3,469,982

PROCESS FOR MAKING PHOTORESISTS

Jack Richard Celeste, 40 Cameron Court, Freehold, N.J. 07728

No Drawing. Continuation-in-part of application Ser. No. 477,016, Aug. 3, 1965. This application Sept. 11, 1968, Ser. No. 759,217

Int. Cl. G03c *1/90, 5/00;* G03f *7/10*

U.S. Cl. 96—35.1 15 Claims

ABSTRACT OF THE DISCLOSURE

A process for forming a photoresist which comprises:

(1) applying to a surface the surface of an unexposed photopolymerizable layer, the other surface being adhered to a film support, then in either order (2) exposing the layer, and (3) stripping the support, and finally, (4) washing away the unexposed areas of the layer. The surface bearing the resist can be etched, plated, or treated in other ways.

This application is a continuation-in-part of application Serial No. 477,016, filed Aug. 3, 1965, now abandoned.

This invention relates to processes and elements for making photoresists. More particularly, it relates to processes wherein photoresist images are formed by photopolymerization techniques.

Various processes and elements have been proposed for producing photoresists. Conventionally, photoresists have been produced using gelatin silver halide photographic emulsions or gelatin layers containing potassium dichromate as the light-sensitive agent. Such layers are image exposed and developed with special solutions and/or warm water. Gelatin and other water-soluble colloid layers have many disadvantages for use as photoresist layers. It is inconvenient to use repeated liquid treatments. In addition water-soluble colloid layers, even though they have become substantially water insolubilized during treatment, are not resistant to moisture. Synthetic binders for light-sensitive silver halide and chromium salts have also been proposed but these, too, require liquid treatments to form the image resist and it is difficult to properly harden such various polymeric synthetic materials which are gellable by the action of light.

In these cases, the synthetic material is applied to the metal or other permanent surface as a liquid coating and then exposed to light either in a liquid gellable state or in a dry state. The coating is done by dipping, whirling or roller coating. This is inconvenient in many cases because of the requirement that either the support, e.g., metal, must be coated at the point of manufacture of the resist composition, or the said composition must be shipped to the user of the resists who must then coat the composition. These piece by piece operations are generally wasteful of resist composition and produce coatings of marginal quality and uniformity. Either procedure has many obvious disadvantages. One of these is that liquid coatings applied to perforated circuit boards in certain cases where electroplating is to be done and connections made through the perforations often cause difficulty. Another disadvantage is that the preparation of photoresists by the above processes involves long drying times by the user and a high risk of dirt settling.

It is an object of this invention to provide a new and improved process for producing photoresists. Another object is to provide a rapid and practical process for producing a durable photoresist. It is a further object of this invention to provide preformed photopolymerizable resist films. Still further objects will be apparent from the following description of the invention.

The process of this invention for forming photoresists on metal or other surfaces, including glass, ceramics, etc., comprises:

(1) applying to a surface a solid photopolymerizable layer having a thickness of at least 0.00005 inch and low to moderate adherence to a thin, flexible, polymeric film support (e.g., .00025–0.008 inch or more); preferably with heating or later heating at a temperature from 40° C. to about 150° C. to increase the degree of adherence between said surface and said layer; then, in either order, (2) exposing the layer, imagewise, to actinic radiation to form a polymeric image; and (3) stripping the film support from the resulting image-bearing layer;

(4) washing away the unexposed areas of the layer to form a resist image of polymeric material; and (5) permanently modifying the adjacent areas on said surface which are unprotected by the resist image by using a reagent capable of etching said areas or depositing a material on said areas. Where the surface is inorganic, step 5 can be eliminated.

The surface can then be treated with a suitable reagent to form an etched surface, or plated or processed in other ways. The polymeric image can then be removed by means of a solvent therefor with the aid of mechanical action, e.g., by rubbing, brushing and/or abrading, etc., or by a combination of one or more such steps.

Photopolymerizable elements useful in accordance with the invention can be made by the conventional procedures disclosed in the prior art patents by coating a photopolymerizable stratum onto a thin, flexible film base or support, which preferably has a high degree of dimensional stability to temperature changes and drying the coated layer. In general, the film support will be chosen so that, at best, there is only a moderate amount or degree of adherence between the coating and the support.

A protective or cover sheet can be applied to the photopolymerizable layer after coating. This can be accomplished by a laminating step. Before applying the photopolymerizable film to the metal surface, the cover sheet is removed.

Photoresist solutions for making the photopolymerizable films that are described above may comprise a wide variety of photopolymerizable compounds and suitable binders therefor. For example, the photopolymerizable materials disclosed in Plambeck U.S. 2,760,863 are quite suitable as are the novel polymerizable polymeric esters disclosed in assignee's Schoenthaler U.S. Ser. No. 451,300, filed Apr. 27, 1965, now Patent No. 3,418,295. These polyesters are made by—

(a) Reacting in an inert organic solvent solution:

(1) A vinyl addition polymer having a wholly carbon chain of atoms and extralinear glycidyl ester groups in recurring intralinear units of the formula:

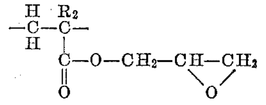

of said chain of atoms, where $R_2$ is a member selected from the group consisting of H and $CH_3$, with (2) Acrylic or methacrylic acid in an amount sufficient to react with all the said glycidyl groups present from 10% to 100%, in the polymer to form an acrylic or methacrylic acid ester therewith, in the presence of (3) An organic tertiary amine esterification catalyst, and (4) An addition polymerization inhibitor;

and recovering a polymeric ester containing extralinear acrylic ester groups from said solution.

The polyesters contain a plurality of units of the formulae:

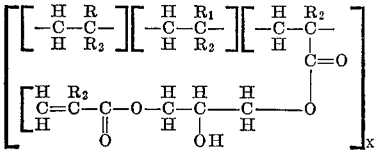

where R and $R_1$ are each a member taken from the group consisting of $$-CN,\ -\overset{\overset{O}{\|}}{C}-OR_3 \text{ and pyrrolidone}$$

$R_3$ is an alkyl group of 1 to 18 carbon atoms, $R_2$ is a member selected from the group consisting of H and $CH_3$ and $x$ is a positive integer of 10 to 1000.

In the Plambeck patent there are disclosed various suitable ethylenically unsaturated compounds, thermoplastic polymeric binders, addition polymerization initiators activatable by actinic light and other constituents. Other suitable ethylenically unsaturated monomers are those disclosed in assignee's patent application, Celeste 3,261,686, July 19, 1966, and assignee's pat. appln. of Cohen and Schoenthaler, U.S. Ser. No. 370,338 filed May 26, 1964, now Patent No. 3,380,831. In the case of the polymerizable polymers, no binder is necessary although a small amount may be used. In addition to photoinitiators, other ingredients such as plasticizers, thermal inhibitors, colorants, fillers, etc. also may be present as is well known in the art. As taught by the above references, some of the ingredients can act in a dual role. For example, in the monomer binder systems the ethylenically unsaturated photopolymerizable monomer can also act as a plasticizer for the thermoplastic binder.

In practicing a preferred embodiment of the invention, an element containing an image-yielding photopolymerizable stratum is made by coating a layer of the photopolymerizable composition disclosed in the above-listed Schoenthaler application on a suitable film support. After drying the photopolymerizable stratum, there is laminated to the surface thereof a removable cover film. The photopolymerizable composition is coated to give a dry coating thickness of about 0.0003 inch. A suitable support film may be chosen from a wide variety of films composed of high polymers, e.g., polyamides, polyolefins, polyesters, vinyl polymers, and cellulose esters and may have a thickness of from 0.00025 inch to 0.008 inch or more. If exposure is to be made before removing the support film, it must, of course, transmit a substantial fraction of the actinic radiation incident upon it. If the support film is removed prior to exposure, no such restrictions apply. A particularly suitable film is a transparent polyethylene terephthalate film having a thickness of about 0.001 inch. Suitable removable cover films may be chosen from the same group of high polymer films described above and may have the same wide range of thicknesses. A cover film of 0.001 inch thick polyethylene is especially suitable. Support and cover films as described above provide good protection to the photopolymerizable resist layer. To apply the resist to, say, a copper-clad fiber glass rigid support to be used as a printed circuit, the cover film is stripped from the element and the resist layer on its supporting film is then laminated with heated resilient pressure rolls to the copper surface of the rigid support. This provides a sensitized surface ready immediately for exposure but still protected from dirt, lint and abrasion by virtue of the original support film. To produce a resist image the element is exposed imagewise through the support film and said film is then peeled off and the exposed resist developed by washing away the unexposed areas with solvent which results in a rigid support bearing a relief resist image on its surface. This element may then be subjected to the conventional operations of plating, etching, etc. as is well known to those skilled in the arts using resist images.

The invention will be further illustrated in and by the following examples which are not intended to limit the invention except as set forth in the claims.

EXAMPLE I

An electrical printed circuit was made as described below.

A solution was prepared of the following ingredients:

| | Grams |
|---|---|
| Poly(methyl methacrylate/acrylonitrile/acrylated glycidyl acrylate, 65/10/25) (made according to Example XIV of the above Schoenthaler application) | 1,196.0 |
| Poly (methyl methacrylate/$\beta$-hydroxy-ethyl acrylate, 90/10) | 557.0 |
| Triethylene glycol diacetate | 262.0 |
| 2-tert.-butylanthraquinone | 142.0 |
| 2,2′-methylene-bis(4-ethyl-6-tert-butyl phenol) | 34.5 |
| Ethyl violet dye (C.I. 42,600) | 2.5 |
| Methyl ethyl ketone to make | 11,000.0 |

The copolymer of methyl methacrylate/$\beta$-hydroxyethyl acrylate 90/10 was prepared by dissolving the monomers in methyl ethyl ketone and polymerizing by the addition of the catalyst N,N′azo-bis-iso-butyronitrile. This copolymer was used as an inert filler.

The composition was skim coated onto a continuous web of a 0.001-inch thick polyethylene terephthalate transparent film and dried at 71° C. to give a coating thickness of about 0.00035 inch. A cover film of 0.001-inch thick polyethylene was then laminated to the dried coating using rubber pressure roller at 60° C. The resulting sandwich element could be conveniently wound into rolls and held for later use.

A piece of copper clad, epoxy-fiber glass board was cleaned by scouring with an abrasive cleaner, swabbing and thoroughly rinsing in water. It was then given a 20-second dip in a dilute hydrochloric acid solution (2 volumes water + 1 volume conc. hydrochloric acid), a second rinse with water and then dried with air jets.

The cover film was removed from a section of the sandwiched photopolymerizable element. The bared resist coating with its support was laminated to the clean copper with the surface of the photopolymerizable layer in contact with the copper surface. The lamination was carried out with the aid of rubber covered rollers operating at 120° C. with a pressure of 3 pounds per lineal inch at the nip, at a rate of 2 feet per minute. The resulting sensitized copper clad board protected as it is by the polyester film, could be held for later use if need be. Actually it was exposed to light through a high-contrast transparency image in which the conducting pattern appeared as transparent areas on an opaque background. The exposure was carried out by placing the sensitized copper clad board (with its polyester film still intact) and the transparency into a photographic printing frame. The exposure was for a period of 5 seconds to a 2500-watt, 45-ampere carbon arc at a distance of 18 inches. After exposure, the polyethylene terephthalate polyester support film was peeled off and discarded leaving the exposed resist adherent to the copper surface. The board was then developed by placing it in a trichloroethylene vapor-spray for 30 seconds during which time the unexposed areas of the photoresist film were dissolved and washed away. This step left the ethyl violet colored resist on the copper in the pattern of the clear areas of the exposing transparency with no resist in the complementary opaque areas.

The board with its adherent image etching apparatus was placed in a Model 600 Spray Etcher, made by Chemcut Div. of Centre Circuits Inc., State College, Pa. The etching apparatus contained a 45° Baumé ferric chloride solution. The element was left in the etching apparatus until the copper was completely etched away in the areas not covered by the resist image. The etched board was rinsed in water and dried, leaving the resist covered copper conducting pattern on the fiber glass board. The resist was finally removed from the copper by scrubbing with a brush or cloth soaked in methylene chloride to give a high quality printed circuit board.

EXAMPLE II

A solution was prepared of the following ingredients:

| | Grams |
|---|---|
| Poly (methyl methacrylate/butyl methacrylate/ acrylated glycidyl methacrylate, 1/1/1) (made according to Example IX of the above Schoenthaler application) | 15.00 |
| Triethylene glycol diacetate | 2.34 |
| 2-tert.-butylanthraquinone | 1.41 |
| Trichlorethylene to make | 125.0 |

The resulting solution was coated on a 0.001-inch thick sheet of polypropylene and air dried. The thickness of the dried coating was about 0.0003-inch.

A sheet of 0.010-inch thick red-dyed and sealed anodized aluminum was cleaned in a trichloroethylene vapor-spray degreaser. The photopolymerizable resist coating was laminated to the anodized surface with heated rubber rollers at a temperature of 105° C. and at 5 feet per minute with 2 pounds of force per lineal inch of nip.

The sensitized element was exposed for 1 minute as described in Example I to a transparency consisting of an opaque line image on a clear background.

After exposure, the polypropylene support film was peeled from the surface leaving the photoresist layer adhered to the anodized surface. The exposed element was then placed in a tray of methyl ethyl ketone for 1 minute, removed and washed briefly with fresh ketone and dried in air. The anodized surface was now covered with exposed resist except in the unexposed line areas which had been washed free of resist.

The aluminum sheet bearing the resist image was then immersed in a 15% aqueous sodium hydroxide solution for about 45 seconds or until the dyed anodized surface had been etched away in areas not covered by the resist. The etched element was washed in water, swabbed, rinsed again and dried. The sheet now showed the original line image in aluminum metal color on a red anodized aluminum field which was still covered with the exposed clear resist. This demonstrates the use of the process for making metal name plates and other decorative articles.

EXAMPLE III

A solution was prepared of the following ingredients:

| | Grams |
|---|---|
| Poly (methyl methacrylate/itaconic acid) (19/1) | 24.5 |
| Pentaerythritol triacrylate (Example I—Celeste & Seide U.S. Ser. No. 274,909, filed 4/23/63) | 7.8 |
| 2-tert.-butylanthraquinone | 0.30 |
| Crystal violet | 0.06 |
| Methyl ethyl ketone to make | 120.0 |

The solution was coated onto a 0.001-inch thick polyethylene terephthalate film and dried in air. The dry thickness was about 0.0005 inch. A copper clad board was prepared, the resist coating laminated to it, and the resulting element exposed exactly as in Example I. The polyethylene terephthalate support film was peeled off and the exposed resist layer washed with carbon tetrachloride to remove the unexposed areas of the resist layer. The dyed resist image remained adhered to the copper surface. Etching of the non-imaged areas of the copper was carried out with 0.5 molar ammonium persulfate solution which removed the copper from the fiber glass support leaving the copper image covered with dyed resist in the light exposed areas. The resist was removed from the copper by washing with methyl ethyl ketone to provide a high quality printed circuit board.

EXAMPLE IV

A solution was prepared from the following ingredients:

| | Grams |
|---|---|
| Poly (methyl methacrylate/methacrylic acid) (9/1) | 306.0 |
| Pentaerythritol triacrylate (see Example III) | 82.5 |
| Ethyl violet | 0.25 |
| 9,10-phenanthrenequinone | 2.5 |
| Acetone to make | 750.0 |

This solution was coated on 0.001-inch thick polyethylene terephthalate film and dried in air to give a layer thickness of about 0.0005 inch. A sheet of cold-rolled steel was cleaned with a degreasing solvent, a detergent and an abrasive cleaner, washed with water, and finally rinsed with acetone. The resist film on its polyethylene terephthalate film support was laminated to the cleaned surface of the steel using heated pressure rollers as in Example II. The resulting photosensitive element was exposed for 3 minutes through a high contrast line (text) transparency as described in Example I. After exposure, the polyethylene terephthalate film was peeled from the resist and discarded. The resist covered steel sheet was washed in carbon tetrachloride to remove the unexposed areas of the resist. After standing for 30 minutes, the imaged steel sheet was immersed in 30% nitric acid until 0.010 inch of the steel had been etched away in areas not covered by the resist. This resulted in a steel relief image which was highly useful as a printing plate.

EXAMPLE V

A solution was made comprising the following:

| | Grams |
|---|---|
| Poly (methyl methacrylate/acrylonitrile/acrylated glycidyl acrylate 65/10/25) made according to Example XIV of the above Schoenthaler application | 56.8 |
| 2-tert.-butylanthraquinone | 3.0 |
| Ethyl violet | 0.18 |
| Methyl ethyl ketone to make | 300 |

This solution was coated onto 1-mil thick polyester film and was allowed to dry at ambient condition for 30 minutes. Dry thickness was about 0.5 mil. The coated material was then laminated to a cleaned copper-clad board as in Example I. Exposure was made through a line transparency for 2 minutes as in Example I. Development in trichloroethylene vapor-spray produced a violet colored resist image of the clear areas of the transparency on the copper surface of the board.

EXAMPLE VI

A solution was prepared as follows:

| | Grams |
|---|---|
| Binder solution* | 306.3 |
| Pentaerythritol triacrylate | 82.5 |
| Ethyl violet dye | 0.25 |
| 2-tert.-butylanthraquinone | 2.5 |
| Acetone to make | 750.0 |

* 24.7% solution of poly(methyl methacrylate/methacrylic acid (90/10) in methyl ethyl ketone.

This solution was coated onto 1-mil thick polyester film and dried. Dry thickness was 0.38 mil.

A glass microscope slide was washed in detergent solution, rinsed in distilled water and then ethanol, and dried. The film was then laminated to the glass at 35° C., applying pressure by the fingers. The element was then exposed for 3 minutes through a high-contrast transparency to light from a carbon arc as in Example I.

After exposure, the polyester film was peeled from the surface and the image was developed by washing in carbon tetrachloride. The polymer resist remained in the areas which had been exposed. The resist-bearing slide was next immersed in 48% hydrofluoric acid solution for 30 seconds and immediately washed in running water. This treatment caused the etching to extend about 2 mils into the glass slide in areas not protected by the resist film. The polymeric resist was next removed by swelling it in methylene chloride and swabbing clean. An etched relief image remained in the glass slide.

EXAMPLE VII

A solution was prepared as follows:

| | Grams |
|---|---|
| Poly(methyl methacrylate) M.W. 30,000 | 37.6 |
| Poly(methyl methacrylate M.W. 60,000 | 12.5 |
| Pentaerythritol triacrylate | 38.1 |
| Triethylene glycol diacetate | 5.4 |
| 2-tertiary-butylanthraquinone | 5.4 |
| 2,2'-methylene-bis-(4-ethyl-6-tertiary-butyl phenol) | 0.7 |
| Victoria pure blue—B.O. (C.I. 42595) | 0.3 |
| Methylene chloride | 500.0 |

The solution was coated onto a 0.001-inch polyethylene terephthalate film and dried in air. The dry thickness was about 0.0005-inch. A white plastic sheet of polyacetal (Delrin ® sold by E. I. du Pont de Nemours and Company) ⅛-inch thick was washed with 95% ethyl alcohol and then with a 10% aqueous $Na_3PO_4$. The surface was polished with 3F pumice. After thoroughly drying, the surface of the coated photosensitive layer was laminated at 100° C. to the plastic sheet. The laminated element was exposed for 90 seconds through the film support in a vacuum printing frame at 27 inches vacuum at a distance of 18 inches from a carbon arc by means of an exposing device identified as a "Nu Arc Plate Maker" (flip-top) manufactured by the Nu Arc Company, Chicago, Ill. The polyethylene terephthalate film was removed by stripping, leaving the exposed photopolymer layer adhered to the polyacetal sheet. The sheet was developed by removing the unexposed areas of the photopolymerizable layer by washing in a spray composed of 90% tetrachloroethylene and 10% isobutyl alcohol. The developed sheet was then placed in a bath containing 30% concentrated hydrochloric acid by volume and the bath heated to boiling for 5 minutes. A relief image 0.004-inch in depth was formed on the sheet. The relief image is capable of being used as a printing plate or as a name plate.

The following example is directed to a process for forming photoresists on a surface having an incised pattern of discrete areas. The process is useful for forming a protective reist over the incised pattern and overcoming disadvantages of the prior art. This is exemplified by the preparation of a multilayer, plated, through-hole circuit board. The board may be comprised of two or more copper layers adhered to and separated by epoxy-fiberglass boards and containing through-holes lined with copper to inter-connect the copper layers. In preparing the multilayer circuit board, selected copper liners in the through-holes must be protected from the copper etchant used to etch the circuit in the outer copper layers, otherwise the inter-connection may be broken.

EXAMPLE VIII

A two-layer, plated, through-hole copper circuit board was cleaned, as described in Example I, and each of the two outer copper surfaces was laminated to a photopolymerizable layer having a thickness of 0.0025 inch at 120° C., said layer being coated on a polyethylene terephthalate film and made as described in Example VII. Each photopolymerizable layer of the laminated element was exposed for 120 seconds in the apparatus described in Example VII. The exposure was through an image-forming transparency having clear areas corresponding to areas slightly exceeding the peripheries of selected plated through-holes. The polyethylene terephthalate films were removed by stripping and the unexposed areas of the photopolymerizable layer were dissolved away in a spray of 1,1,1-trichloroethane leaving a protective resist on the copper surfaces and over areas of said selected plated through-holes. The copper was etched away in ferric chloride as in Example I, leaving areas under the protective resist unaffected. The resist was readily removed with $CH_2Cl_2$ to yield a two-layer, plated, through-hole circuit board.

This process is useful for making decorative photoengravings and chemically milled and electro-formed elements.

The etchable metal surface may be magnesium, zinc, copper, alloys of such metals, aluminum, anodized and dyed anodized aluminum, steel, steel alloys, beryllium-copper alloys.

In addition to the polymerizable polymers used in the resist coating solutions of Examples I and II above, one can use the polymers disclosed in Ser. No. 451,300. These polymers are particularly preferred for the process of this invention because their photosensitivity is less affected by oxygen and they are less sensitive to oxygen-induced reciprocity failure. These polymers, being preformed, are more efficient in terms of photographic speed because all of the light energy absorbed is used for cross-linking rather than for linear chain polymerizing and cross-linking.

However, the monomer-binder systems as shown in Examples III and IV are also quite useful in the invention. In addition to the binders and ethylenically unsaturated monomers shown, the photopolymerizable compositions may comprise other suitable binders and monomers. Additional binders include:

(A) Copolyesters, e.g., those prepared from the reaction product of a polymethylene glycol of the formula $HO(CH_2)nOH$, wherein *n* is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids;

(B) Nylons or polyamides, e.g., N-methoxymethyl polyhexamethylene adipamide;

(C) Vinylidene chloride copolymers, e.g., vinylidene chloride/acrylonitrile; vinylidene chloride/methacrylate and vinylidene chloride/vinyl acetate copolymers;

(D) Ethylene/vinyl acetate copolymers;

(E) Cellulosic ethers, e.g., methyl cellulose, ethyl cellulose and benzyl cellulose;

(F) Synthetic rubbers, e.g., butadiene/acrylonitrile copolymers, and 2-chlorobutadiene-1,3-polymers;

(G) Cellulose esters, e.g., cellulose acetate, cellulose acetate succinate and cellulose acetate butyrate;

(H) Polyvinyl esters, e.g., polyvinyl acetate/acrylate, polyvinyl acetate/methacrylate and polyvinyl acetate;

(I) Polyacrylate and alpha-alkyl polyacrylate esters, e.g., polymethyl methacrylate and polyethyl methacrylate;

(J) High molecular weight polyethylene oxides of polyglycols having average molecular weights from about 4,000 to 1,000,000;

(K) Polyvinyl chloride and copolymers, e.g., polyvinyl chloride/acetate;

(L) Polyvinyl acetal, e.g., polyvinyl butyral, polyvinyl formula;

(M) Polyformaldehydes;

(N) Polyurethanes;

(O) Polycarbonates;

(P) Polystyrenes.

In addition to the ethylenically unsaturated monomers mentioned above, the following free-radical initiated, chain-propagating, addition polymerizable, ethylenically unsaturated compounds having a molecular weight of at least 300 and which can be used with the above-described polymer compounds. These include, preferably, an alkylene or a polyalkylene glycol diacrylate prepared from an alkylene glycol of 2 to 15 carbons or a polyalkylene ether glycol of 1 to 10 ether linkages, and those disclosed in Martin and Barney, U.S. Patent 2,927,022, issued Mar. 1, 1960, e.g., those having a plurality of addition polymerizable ethylenic linkages, particularly when present as terminal linkages, and especialy those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures.

A preferred class of free-radial generating addition polymerization initiators activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in Plambeck U.S. Patent 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin and α-phenylbenzoin. In addition the photoreducible dyes and reducing agents disclosed in Oster U.S. Patent 2,850,445; 2,875,047; 3,097,096; and Oster, et al. U.S. 3,074,974; 3,097,097, and 3,145,104 as well as dyes of the phenazine, oxazine, and quinone classes may be used.

Suitable thermal polymerization inhibitors that can be used in photopolymerizable compositions include p-methoxyphenol, hydroquinone, and alkyl and aryl-substituted hydroquinones and quinones, tert.-butyl catechol, pyrogallol, copper resinate, napthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil.

As indicated in the examples, various dyes may be added to increase the visibility of the resist image. Pigments may also be used in this capacity. Any colorant used, however should preferably be transparent to the actinic radiation used.

The process of this invention has many advantages over the prior art. It eliminates the use of dimensionally unstable gelatin layers which are sensitive to moisture and require repeated aqueous treatments to form a resist image. It eliminates the special coating and drying requirements imposed on users of the resists in applying liquid coatings to individual pieces to be imaged. The invention offers a simple and easy method of rapidly applying a highly uniform resist material to an object to be imaged. An object to be imaged can be sensitized and ready for exposure in seconds as opposed to minutes or hours for the conventional methods of forming resists which involve coating and drying at the site of use. In addition, the sensitized object can be completely protected from dirt and abrasion by virtue of the fact that the original support film acts as a protective cover sheet after the resist element is applied to the surface to be imaged. Development is readily carried out and, if a dyed resist film is used, produces a dyed image directly without a separate dyeing operation. Dyed layers also facilitate inspection at any stage of the process. The photoresist layers sandwiched between two polymeric films after manufacture can easily be stocked as inventory and easily handled without damage until ready for use. The manufacture of the sandwiched photoresist element is easily carried out with high precision on the continuous web coating machinery well known in the photographic manufacturing industry.

Where it is desired to image a perforated element, the invention provides a method of laying down a resist without plugging the perforation holes as would be the case with liquid coatings. This is important where the holes are used for making soldered connections.

In the process of the present invention, coatings of the resist on its supporting film can be made on precision continuous web coating machinery capable of highly uniform application over large areas. Dryers can remove all solvent from the coatings before the web is wound up. These operations, if carried out under clean conditions, especially if a cover film is laminated to the resist coating, can produce extremely high quality, dirt-free resist coatings which are completely protected in the sandwich form until use. This also facilitates thorough inspection during manufacture. To make a resist image on, for example, a metal support such as copper, it is only necessary to strip off the laminated cover film and laminate the uncovered surface of the photoresist layer to the metal support. The resist layer is still protected from lint, dust and other kinds of harmful dirt as well as from abrasion, scratches, etc. by the original support film. At the same time, it can be easily exposed through said film. The whole operation of the process of the invention is much less time-consuming and much simpler to carry out by the user than the processes of the prior art.

An important advantage of the invention is that the thin photopolymerized resists are stronger and more durable than previously used gelatin layers. The resists are more resistant to strong etching solutions, and etched surfaces that correspond more faithfully to the original images can be obtained, readily. The photopolymer resists, moreover, are more resistant to the action of moisture and aqueous washing liquids, and processing to a relief is simpler than in the case of making a gelatin resist.

Many other advantages will be obvious to those skilled in the art of making an etched relief image by means of a photoresist.

The embodiments of the invention in which an exclusive property or privilege is claimed are defined as follows:

1. A process for forming a photoresist on a surface which comprises:

(1) applying to a surface the surface of a solid, unexposed photopolymerizable layer having a thickness of at least .00005 inch, while the other surface of the layer has adhered thereto with low to moderate adherence a thin, flexible, polymeric film support, then in either order;
(2) exposing the layer, imagewise, to actinic radiation to form a polymeric image in the layer; and
(3) stripping the film support from the resulting image-bearing layer;
(4) washing away the unexposed areas of the layer to form a resist image of polymeric material; and
(5) permanently modifying the adjacent areas on said surface which are unprotected by the resist image by using a reagent capable of etching said areas or depositing a material on said area.

2. A process according to claim 1, wherein, prior to step (2), the layer is heated up to about 150° C. to increase the degree of adherence between the layer and said surface.

3. A process according to claim 1, wherein said surface is an etchable surface.

4. A process according to claim 1, wherein said surface is a clean metal surface.

5. A process according to claim 1, wherein said surface is a glass surface.

6. A process according to claim 1, wherein said surface is copper.

7. A process according to claim 1, wherein said surface is anodized aluminum.

8. A process according to claim 1, wherein said surface is a dyed anodized aluminum surface.

9. A process according to claim 1, wherein said film support is an uncoated polyethylene terephthalate film.

10. A process according to claim 1, wherein said photopolymerizable layer comprises (a) a polymer containing a plurality of units of the formulae:

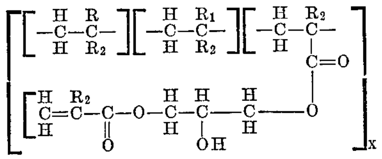

where R and $R_1$ are each a member taken from the group consisting of $$-CN,\ -\overset{O}{\overset{\|}{C}}-OR_3 \text{ and pyrrolidone}$$

$R_3$ is an alkyl group of 1 to 18 carbon atoms, $R_2$ is a member selected from the group consisting of H and $CH_3$ and $x$ is a positive integer of 10 to 1000; and (b) an addition polymerization initiator activatable by actinic light.

11. A process for forming a photoresist on an inorganic surface which comprises:

(1) applying to said inorganic surface the surface of a solid, unexposed photopolymerizable layer having a thickness of at least .00005-inch, while the other surface of the layer has adhered thereto with low to moderate adherence a thin, flexible, polymeric film support, then in either order;

(2) exposing the layer, imagewise, to actinic radiation to form a polymeric image in the layer; and (3) stripping the film support from the resulting image-bearing layer; and (4) washing away the unexposed areas of the layer to form a resist image of polymeric material.

12. A process for forming a resist on an inorganic surface containing an incised pattern of discrete areas which comprises:

(1) applying to said surface a layer of a solid, unexposed photopolymerizable layer having a thickness of at least 0.0005 inch, while the other surface of the layer has adhered thereto with low to moderate adherence a thin polymeric support, said layer spanning said incised pattern, then, in either order;

(2) exposing the layer to actinic radiation through an image-bearing transparency having clear areas corresponding to the image and at least one of said discrete areas of the incised pattern to form a polymeric image in the layer; and (3) stripping the film support from the resulting image-bearing layer; and (4) washing away the unexposed areas of the layer to form a resist image of polymeric material.

13. A process according to claim 12, wherein said surface is a copper surface.

14. A process for forming a protective resist on a surface containing an incised pattern of discrete areas which comprises:

(1) applying to said surface a layer of a solid, unexposed photopolymerizable layer having a thickness of at least 0.0005 inch, while the other surface of the layer has adhered thereto with low to moderate adherence a thin polymeric support, said layer spanning said incised pattern, then, in either order;

(2) exposing the layer to actinic radiation through an image-bearing transparency having clear areas corresponding to the image and at least one of said discrete areas of the incised pattern to form a polymeric image in the layer; and (3) stripping the film support from the resulting image-bearing layer;

(4) washing away the unexposed areas of the layer to form a resist image of polymeric material; and (5) permanently modifying the areas on said surface and incised pattern which are unprotected by the resist image by using a reagent capable of etching said areas.

15. A process according to claim 14, wherein said surface is copper.

References Cited

UNITED STATES PATENTS

| | | | |
|---|---|---|---|
| 2,760,863 | 8/1959 | Plambeck | 96—35.1 |
| 3,060,026 | 10/1962 | Heiart | 96—115 |
| 3,129,098 | 4/1964 | Kitson | 96—35.1 |
| 3,261,686 | 7/1966 | Celeste et al. | 96—115 |

NORMAN G. TORCHIN, Primary Examiner

R. H. SMITH, Assistant Examiner

U.S. Cl. X.R.

96—36.3, 83

PO-1050
(5/69)

UNITED STATES PATENT OFFICE
CERTIFICATE OF CORRECTION

Patent No. 3,469,982 Dated September 30, 1969

Inventor(s) Jack Richard Celeste

It is certified that error appears in the above-identified patent and that said Letters Patent are hereby corrected as shown below:

Column 1, line 4, after "07728", there should be added -- , Assignor to E. I. du Pont de Nemours and Company, Wilmington, Delaware, a corporation of Delaware --.

SIGNED AND
SEALED
MAY 26 1970

(SEAL)
Attest:

Edward M. Fletcher, Jr.
Attesting Officer

WILLIAM E. SCHUYLER, JR.
Commissioner of Patents